(12) United States Patent
Lim et al.

(10) Patent No.: US 10,714,658 B2
(45) Date of Patent: Jul. 14, 2020

(54) MICRO LED DISPLAY PANEL AND METHOD OF MANUFACTURING SAME

(71) Applicant: LG Display Co., Ltd., Seoul (KR)

(72) Inventors: Jongjoo Lim, Suwon-si (KR); Junghan Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/163,574

(22) Filed: Oct. 18, 2018

(65) Prior Publication Data
US 2019/0198715 A1    Jun. 27, 2019

(30) Foreign Application Priority Data

Dec. 22, 2017  (KR) .................. 10-2017-0177835

(51) Int. Cl.
| | | |
|---|---|---|
| *H01L 33/38* | (2010.01) | |
| *H01L 27/32* | (2006.01) | |
| *H01L 25/16* | (2006.01) | |
| *H01L 33/56* | (2010.01) | |
| *G02F 1/13357* | (2006.01) | |
| *H01L 33/42* | (2010.01) | |
| *H01L 33/50* | (2010.01) | |
| *H01L 27/15* | (2006.01) | |
| *H01L 33/62* | (2010.01) | |

(52) U.S. Cl.
CPC ...... *H01L 33/385* (2013.01); *G02F 1/133603* (2013.01); *G02F 1/133617* (2013.01); *H01L 25/167* (2013.01); *H01L 27/156* (2013.01); *H01L 27/322* (2013.01); *H01L 27/3246* (2013.01); *H01L 33/42* (2013.01); *H01L 33/502* (2013.01); *H01L 33/56* (2013.01); *H01L 33/505* (2013.01); *H01L 33/62* (2013.01)

(58) Field of Classification Search
CPC .......................................... H01L 33/0004–648
See application file for complete search history.

(56) References Cited

U.S. PATENT DOCUMENTS

| | | | |
|---|---|---|---|
| 2009/0058265 A1* | 3/2009 | Komatsu ............. | C09K 11/565 |
| | | | 313/503 |
| 2016/0293634 A1* | 10/2016 | Kim .................... | H01L 27/124 |
| 2017/0179192 A1* | 6/2017 | Zhang .................. | H01L 25/16 |

* cited by examiner

*Primary Examiner* — Cuong B Nguyen
(74) *Attorney, Agent, or Firm* — Fenwick & West LLP (57) ABSTRACT

A micro LED display panel according to the present disclosure includes a substrate including a light emitting region and a driving region; a micro LED arranged in the light emitting region on the substrate, a transistor element arranged in the driving region on the substrate and driving the micro LED, a first connection wiring electrically connecting the micro LED and the transistor, and a color adjustment layer arranged in the light emitting region under the substrate. The micro LED display panel according to the present invention can form the micro LED and the transistor element for driving the micro LED on a growth substrate such as a sapphire substrate together on the same plane so that the micro LED does not require a transfer process, and it is possible to manufacture polysilicon when manufacturing the micro LED, and can simplify the process.

20 Claims, 6 Drawing Sheets

MICRO LED DISPLAY PANEL AND METHOD OF MANUFACTURING SAME

CROSS-REFERENCE TO RELATED APPLICATIONS

This application claims priority to and the benefit of Republic of Korea Patent Application No. 10-2017-0177835, filed on Dec. 22, 2017, the disclosure of which is incorporated herein by reference in its entirety.

BACKGROUND

1. Field of the Invention

The present disclosure relates to a display panel, and more particularly, to a micro LED display panel.

The present disclosure also relates to a method of manufacturing a micro LED display panel.

2. Description of Related Art

Recently, the most widely developed display devices include a Liquid Crystal Display (LCD), an Organic Light Emitting Diode (OLED) display, and a Quantum dot Light Emitting Diode (QLED) display, etc.

In the case of the liquid crystal display device from among these, there is no self-light emitting means in the display panel. Accordingly, in the case of the LCD device, a separate backlight for supplying light to the display panel has to be provided, and a nitride-based LED has been mainly used as a light source.

On the other hand, in the case of the OLED display and the QLED display, they have the OLED and the QLED that emit light themselves, so that no separate backlight is required, and a response speed is high, and a light emitting efficiency, a brightness, and viewing angle are large. However, the QLED and the OLED require encapsulation technology to prevent a penetration of moisture, air, etc.

A micro LED generally means an LED having a size of one side of 100 μm or less. This corresponds to about ¹/₁₀ or less size compared to the general LEDs. These micro LEDs are known to have an energy efficiency as high as about 20% or more than the general LEDs, have a small heat generation rate due to their small size, and have a small power consumption. Due to these advantages, many studies have been made to apply the micro LEDs to the display devices.

However, the micro LED have not yet been applied to the display because it lacks technology to transfer a chip on which the micro LED is formed to each pixel of the display panel.

In a process of transferring the chip on which the micro LED is formed to each pixel of the display panel, an accuracy is closely related to a defect occurrence rate of the display panel. Also, the speed of a transfer process is related to a production cost reduction. Accordingly, studies are actively proceeded to improve the transfer process speed for shortening the production cost while accurately transferring the chip on which the micro LED is formed to each pixel of the display panel.

In addition, research has been conducted on a method of forming a pixel of the display panel without transferring a chip on which the micro LED is formed to a display panel. A transistor element can be formed on the micro LED in order to form the micro LED and drive the micro LED. Since a contact hole having a high aspect ratio has to be formed in order to connect the transistor element and the micro LED, a high process accuracy is required, and a thickness of an entire display device is increased since it is a stacked structure.

SUMMARY OF THE INVENTION

It is an object of the present disclosure to provide a micro LED display panel in which a micro LED and a transistor element for driving the micro LED are arranged on the same plane.

In addition, it is another object of the present disclosure to provide a method of manufacturing a micro LED display panel without transferring a chip on which the micro LED is formed.

The micro LED display panel according to the embodiments of the present invention for overcoming the above problem includes a substrate, a micro LED, a transistor element, a first connection wiring, and a color adjustment layer.

The substrate includes a light emitting region and a driving region. The micro LED is arranged in the light emitting region on the substrate. The transistor element is arranged in the driving region on the substrate and drives the micro LED. The first connection wiring electrically connects the transistor element and the micro LED so that the transistor element can drive the micro LED. The color adjustment layer is arranged in the light emitting region under the substrate.

According to the above configuration, the micro LED and the transistor element for driving the micro LED are arranged on the same plane. Accordingly, the thickness of the micro LED display panel can be thinned, and a contact hole having a relatively low aspect ratio can be formed as compared to a stacked structure, so that a connection between the micro LED and the transistor element for driving the micro LED is easy.

The substrate may be a sapphire substrate, and the micro LED may be a nitride-based micro LED, and the transistor device may be a polysilicon thin film transistor device. The nitride-based micro LED can be formed on a sapphire growth substrate by a MOCVD process at about 900° C. to about 1300° C., and the temperature is high enough to convert an amorphous silicon into polysilicon. Accordingly, polysilicon can be manufactured without a separate laser process, and a polysilicon thin film transistor can be manufactured on the sapphire substrate based on the above.

Specifically, the first connection wiring may be a wiring for electrically connecting a p-type semiconductor layer of the micro LED and a drain electrode of the transistor element. In addition, a second connection wiring for connecting a n-type semiconductor layer of the micro LED with a voltage source to source line (VSS) may be further included. The voltage source to source line may be arranged on the substrate. As another example, the voltage source to source line may be arranged on a substrate for a display device such as a glass substrate on which the micro LED display panel according to the present invention is mounted.

In addition, a protection layer arranged on the transistor element and the micro LED can be further included. The first connection wiring can be arranged through the contact hole penetrating through the protection layer. Thus, a wire bonding process for connecting the micro LED and the transistor element for driving the micro LED can be omitted. On the other hand, the second connection wiring can be also arranged through the contact hole penetrating through the protection layer.

In addition, the color adjustment layer may include a color conversion film and/or a color filter including at least one of a quantum dot and a fluorescent material. Through this color adjustment layer, a RGB full color can be realized.

In addition, a bank layer arranged in a region except the light emitting region under the substrate can be further included. By forming the bank layer in an region other than the light emitting region, a light leakage preventing effect can be obtained.

A method for manufacturing a micro LED display panel according to the embodiments of the present invention for overcoming the above problems includes: arranging an amorphous silicon layer and a temporary protection layer in a driving region on a substrate including a light emitting region and the driving region; arranging an n-type semiconductor layer, an active layer and a p-type semiconductor layer on the substrate on which the amorphous silicon layer and the temporary protection layer are arranged, and converting the amorphous silicon layer into a polysilicon layer; removing the n-type semiconductor layer, the active layer, and the p-type semiconductor layer in a remaining region except the light emitting region to manufacture a micro LED; removing the temporary protection layer, and then manufacturing the transistor element on the polysilicon layer; and arranging a color adjustment layer in the light emitting region under the substrate.

The method can further include, after manufacturing the transistor element, forming a first connection wiring for electrically connecting the p-type semiconductor layer of the micro LED to a drain electrode of the transistor element; and forming a second connection wiring for electrically connecting the n-type semiconductor layer of the micro LED to a voltage source to source line (VSS). The first connection wiring and the second connection wiring may be formed sequentially and simultaneously.

Through these processes, the micro LED and the transistor element for driving the micro LED can be formed on the same plane on the substrate, and in particular, the micro LED display panel can be manufactured without transferring the micro LED.

The substrate may be a sapphire substrate, and the micro LED may be a nitride-based micro LED. A nitride semiconductor represented by GaN can be epitaxially grown on the sapphire substrate with an excellent crystal quality.

In addition, the n-type semiconductor layer, the active layer, and the p-type semiconductor layer are formed by the MOCVD process, and the amorphous silicon layer may be converted into polysilicon by heat during the process of forming the n-type semiconductor layer, the active layer, and the p-type semiconductor layer. The MOCVD process for epitaxially growing the nitride semiconductor is mainly performed at a high temperature of about 900° C. to about 1300° C., and the temperature corresponds to a temperature sufficient to convert the amorphous silicon into a crystalline silicon. Accordingly, when the MOCVD process is performed at a high temperature in a state in which the amorphous silicon layer is arranged, it can be converted into the crystalline silicon without a separate heat treatment or laser irradiation with regard to the amorphous silicon layer.

In addition, the method may further include arranging the protection layer on the substrate on which the transistor element and the micro LED are disposed. The first connection wiring and the second connection wiring may be formed through contact holes penetrating through the protection layer. The first connection wiring and the second connection wiring can be arranged on different planes or can be arranged on the same plane.

Through a wiring connection using the protection layer, the micro LED can be easily electrically connected to the transistor element and the voltage source to source line without a separate wire bonding process. In addition, since the micro LEDs and the transistor element for driving the micro LED are arranged on the same plane on the substrate, the aspect ratio of the contact holes can be relatively low as compared with the stacked structure.

In the case of the method of manufacturing a micro LED display panel according to the present invention, the micro LED and the transistor element for driving the micro LED are formed on the same plane on the growth substrate such as the sapphire substrate, so that the micro LED does not need to be transferred.

In addition, in the case of the micro LED display panel according to the present invention, the thickness of the panel can be thinned by arranging the micro LED and the transistor element for driving the micro LED on the same plane.

Embodiments also relate to a micro light emitting diode (LED) display panel. The micro LED display panel includes a substrate having a light emitting region and a driving region, a micro LED arranged in the light emitting region on the substrate, a transistor element arranged in the driving region on the substrate and drives the micro LED, a first protection layer covering the micro LED and the transistor element. The first protection layer includes one or more first contact holes. The micro LED display panel also includes a first connection wiring electrically connecting the micro LED to the transistor element through the one or more first contact holes in the first protection layer.

Embodiments also relate to a method for manufacturing a micro light emitting diode (LED) display panel. A transistor element is formed on a substrate having a light emitting region and a driving region. The transistor element is arranged in the driving region of the substrate. A micro LED is formed on the substrate. The micro LED is arranged in the light emitting region of the substrate. A first protection layer is formed on the transistor element and on the micro LED. The first protection layer includes one or more first contact holes. A first connection wiring electrically connects the micro LED to the transistor element through the one or more first contact holes.

Embodiments also relate to a micro light emitting diode (LED) display panel. The micro LED display panel includes a substrate having a light emitting region and a driving region, a micro LED arranged in the light emitting region on the substrate, a transistor element arranged in the driving region on the substrate that drives the micro LED. The transistor element is disposed horizontally adjacent to the micro LED on the substrate. The micro LED display panel also includes a protection layer covering the micro LED and the transistor element, and a first connection wiring electrically connecting the micro LED to the transistor element.

DETAILED DESCRIPTION OF EXEMPLARY EMBODIMENTS

Hereinafter, an embodiment of a micro LED display panel according to the present invention will be described with reference to the drawings.

The terms including the ordinal numbers such as a first, a second, etc. in the following can be used to describe various components, but the corresponding components are not limited by such terms. These terms are used only to distinguish one component from another.

Also, in the present invention, the expression "is on~" means not only "it is immediately on the other part in a state in which any part is in contact with the other part" but also "it is on the other part in a state in which any part is in non-contact with the other part or the third part is further formed in the middle".

Figure 1:
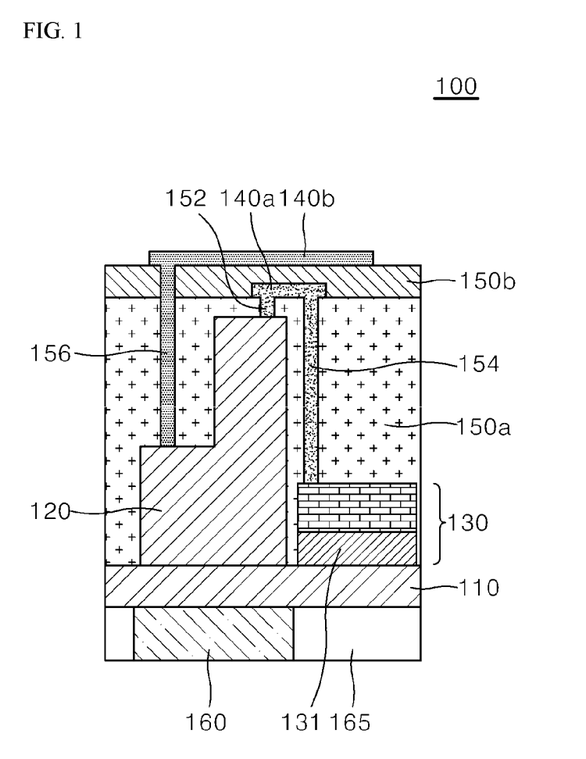
FIG. 1 is a schematic cross-sectional view of a micro LED display panel in accordance with an exemplary embodiment of the present disclosure.

FIG. 1 is a schematic cross-sectional view of a micro LED display panel in accordance with an exemplary embodiment of the present disclosure.

Referring to FIG. 1, the micro LED display panel 100 according to the present disclosure includes a substrate 110, a micro LED 120, a transistor element 130, a first connection wiring 140a, and a color adjustment layer 160.

The substrate 110 may include a light emitting region and a driving region. In FIG. 1, the region in which the micro LED 120 is arranged may be the light emitting region, and the region in which the transistor element 130 is arranged may be the driving region.

The substrate 110 is a sapphire substrate, and the micro LED 120 is a nitride-based micro LED, and the transistor element 130 may be a polysilicon thin film transistor element, but is not limited thereto. The substrate 110, the micro LED 120, and the transistor element 130 can be changed depending on the structures and properties of the micro LED 120 and the transistor element 130. For example, the transistor element 130 may be an oxide thin film transistor element.

Also, the substrate 110 may be gallium nitride (GaN) substrate for a nitride-based micro LED. However, a single crystal substrate 110 using GaN is difficult to manufacture and has a disadvantage of high unit cost. Accordingly, the substrate 110 can be applied with sapphire, or Si (silicon), SiC (silicon carbide), GaAs (gallium arsenide), and ZnO (zinc oxide), which are relatively easy to obtain and have a low unit cost. A sapphire substrate capable of forming a high quality nitride semiconductor with a relatively small difference in lattice constant from the nitride semiconductor is more preferable.

Amorphous silicon can be converted into polysilicon in the process of manufacturing nitride-based micro LEDs on the sapphire substrate.

Figure 2:
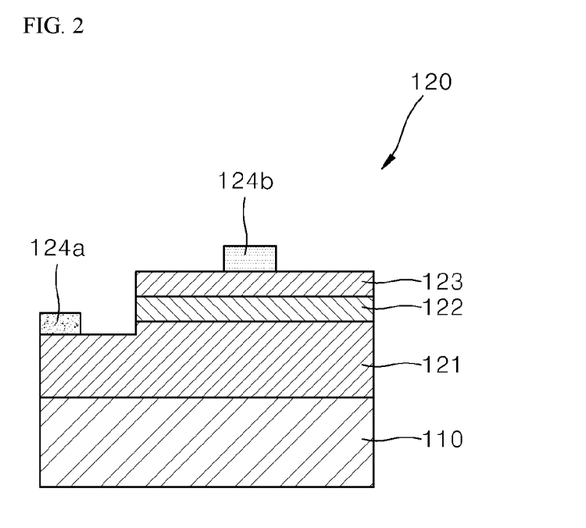
FIG. 2 shows an example of a cross-sectional structure of a micro LED in accordance with an embodiment of the present disclosure.

The micro LED 120 may be arranged in the light emitting region on the substrate 110. FIG. 2 shows an example of a cross-sectional structure of the micro LED 120.

The micro LED 120 may include an n-type semiconductor layer 121, an active layer 122, and a p-type semiconductor layer 123. In the active layer 122, the electrons supplied from the n-type semiconductor layer 121 and the holes supplied from the p-type semiconductor layer 123 are recombined to generate light. As shown in FIG. 2, the micro LED 120 may have a structure in which at least a part of the n-type semiconductor layer 121 extends horizontally beyond the p-type semiconductor layer 123. The second connection wiring 140b may contact the part of the p-type semiconductor layer 123. Of course, reference numeral 121 may be a p-type semiconductor layer, and reference numeral 123 may be an n-type semiconductor layer. Hereinafter, it is explained by assuming that reference numeral 121 is an n-type semiconductor layer and reference numeral 123 is a p-type semiconductor layer.

The micro LED 120 may include a nitride-based semiconductor represented by GaN. For example, n-GaN as the n-type semiconductor layer 121, GaN/InGaN as the active layer 122, and p-GaN as the p-type semiconductor layer 123 can be presented. In the case of the p-type conductive layer 123, it has the relatively high resistance, a conductive layer 124b being made of a metal such as Al, Cu, Cr, or Ni, a transparent conductive oxide (TCO) such as Indium Tin Oxide (ITO) or Fluorine-doped Tin Oxide (FTO), etc. can be further arranged for a current disperse of the p-type semiconductor layer 123. Another conductive layer 124a may be further arranged on the n-type semiconductor layer 121 as well.

Meanwhile, a buffer layer made of AlN, GaN, etc. may be further included between the substrate 110 and the n-type semiconductor layer 121 to improve a crystal quality. In addition, the micro LED 120 may include various known functional layers.

Figure 3:
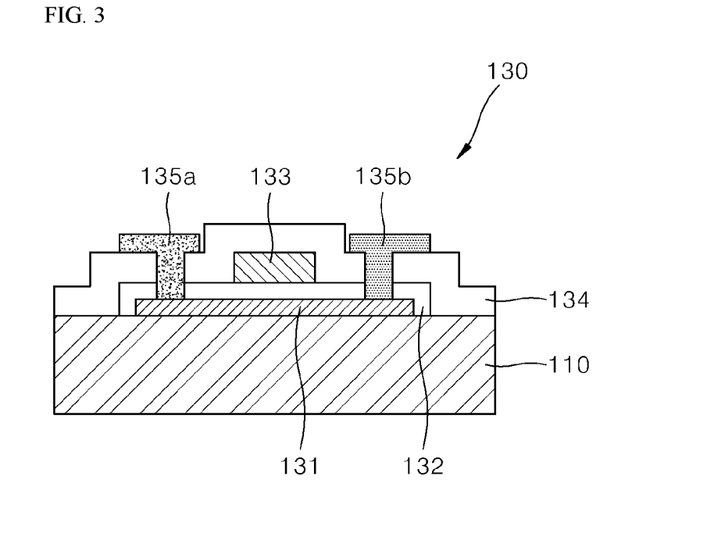
FIG. 3 shows an example of a cross-sectional structure of a transistor element in accordance with an embodiment of the present disclosure.

The transistor element 130 is arranged in the driving region on the substrate 110 and serves to drive the micro LED 120. The transistor element 130 may be disposed horizontally adjacent to the micro LED 120 on the substrate 110. At least a part of the transistor element 130 and at least a part of the micro LED 120 may contact the same substrate 110. FIG. 3 shows an example of the cross-sectional structure of the transistor element 130 of FIG. 1 in accordance with an embodiment of the present disclosure.

Referring to FIG. 3, the transistor element 130 may include an active layer 131 including a channel region, a source region, and a drain region. The active layer 131 may be an amorphous silicon semiconductor material, a polysilicon semiconductor material, or an oxide semiconductor material. The active layer 131 may form a channel between a drain electrode 135a and a source electrode 135b. The transistor element 130 may include a gate insulating layer 132 formed with the contact hole on the active layer 131, a gate electrode 133 formed on the gate insulating layer 132, an inter layer dielectric 134 formed with the contact hole on the gate electrode 133 and the gate insulating layer 132, the drain electrode 135a connected with the drain region of the active layer 131 through the contact hole of the gate insulating layer 132 and the inter layer dielectric 134, and the source electrode 135b connected to the source region of the active layer 131. Since the transistor element 130 is disposed horizontally adjacent to the micro LED 120, the transistor element 130 may not overlap with the micro LED 120 in a vertical direction. For example, the active layer 131 may not overlap with the micro LED 120 in a vertical direction that is a direction perpendicular to the substrate 110.

The first connection wiring 140*a* may serve to electrically connect the p-type semiconductor layer 123 of the micro LED 120 and the drain electrode 135*a* of the transistor element 130. Meanwhile, the second connection wiring 140*b* may be further included and the second connection wiring 140*b* serves to connect the n-type semiconductor layer 121 of the LED 120 and the voltage source to source line VSS (referring to FIG. 5).

In addition, a first protection layer 150*a* may be further arranged on the substrate 110 on which the micro LED 120 and the transistor element 130 for driving the micro LED 120 are arranged. In addition, a second protection layer 150*b* may be further arranged on the first protection layer 150*a*. The first protection layer 150*a* and the second protection layer 150*b* may be formed of an organic material such as a Photo Acryl Compound (PAC), an inorganic material such as $SiO_2$ or $SiN_x$, with a single layer or a multilayer, and serve as an insulating layer and a planarization layer.

Meanwhile, referring to FIG. 1, the first connection wiring 140*a* may be arranged under the second protection layer 150*b* in order to connect the micro LED 120 and the transistor element 130. In view of a process aspect, the first protection layer 150*a* is arranged on the substrate 110 and a contact hole penetrating through the first protection layer 150*a* is formed to connect the micro LED 120 and the transistor element 130, and the first connection wiring 140*a* may be arranged, and then the second protection layer 150*b* may be arranged. The first protection layer 150*a* may be formed with one or more first contact holes 152, 154 to electrically connect the micro LED 120 and the thin film transistor. Specifically, the first connection wiring 140*a* may electrically connect the micro LED 120 to the thin film transistor through the one or more first contact holes formed in the first protection layer 150*a*. The first connection wiring 140*a* may include a first part extending vertically down to contact an exposed portion of the micro LED 120, specifically the p-type semiconductor layer 123, through a contact hole 152, and a second part extending vertically down to contact an exposed portion of the transistor element 130, specifically the drain electrode, through another contact hole 154 in the first protection layer 150*a*.

On the other hand, a part of the second connection wiring 140*b* may be arranged on the second protection layer 150*b*. The second connection wiring 140*b* may be arranged to connect the micro LED 120 and the voltage source to source line VSS after forming the contact hole penetrating through the first protection layer 150*a* and the second protection layer 150*b*. Thus, the second connection wiring 140*b* may electrically connect the micro LED 120 to the voltage source to source line VSS through one or more second contact holes 156 in the first protection layer 150*a* and second protection layer 150*b*. The voltage source to source line VSS may extend in a direction parallel to the substrate 110.

The color adjustment layer 160 is arranged in a light emitting region under the substrate 110, and may include at least one of a color conversion film and a color filter.

The color conversion film may include a color conversion material such as a fluorescent material or a quantum dot. For example, when blue light is emitted from the micro LED 120, a white light can be realized when the color adjustment layer 160 includes a color conversion material such as a red fluorescent material and a green fluorescent material. In addition, when the white light is emitted from the LED 120, a blue color filter, a green color filter, and a red color filter may be arranged in the color adjustment layer 160 for each light emitting region. Also, the red light, the green light, and the blue light can be independently emitted according to the light emitting region while the white light passes through the blue color filter, the green color filter, and the red color filter.

The micro LED display panel according to the present disclosure can realize a RGB full color through the color adjustment layer 160.

Meanwhile, a bank layer 165 may be arranged in a region except the light emitting region under the substrate 110. By forming the bank layer 165 in a region other than the light emitting region, a light leakage preventing effect can be obtained.

Figure 4:
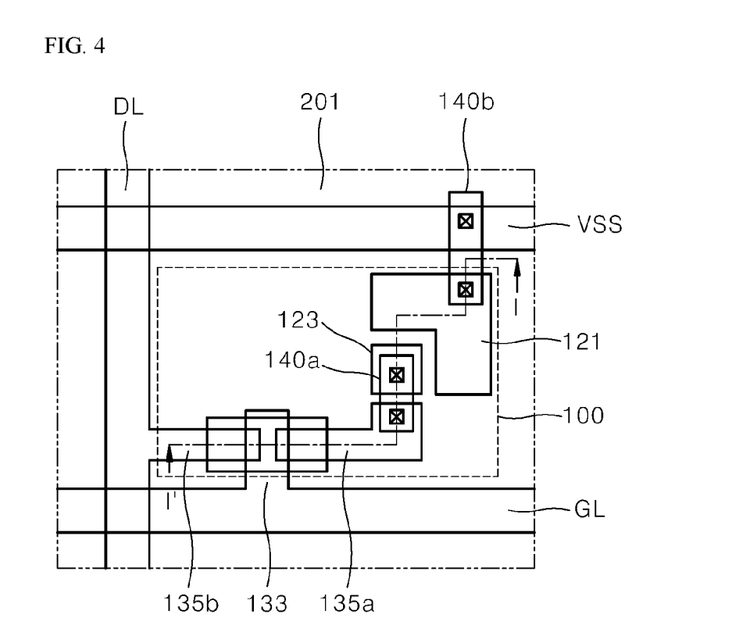
FIG. 4 shows a schematic plan view of a display device including a micro LED display panel in accordance with an exemplary embodiment of the present disclosure.
Figure 5:
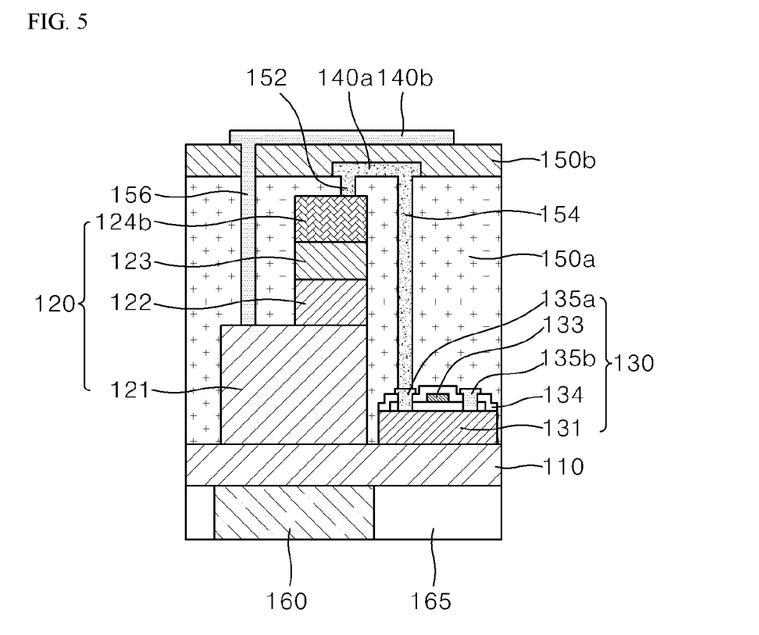
FIG. 5 shows an example of a cross-sectional structure taken along line I-I' of FIG. 4 in accordance with an embodiment of the present disclosure.

FIG. 4 shows a schematic plan structure of a display device including a micro LED display panel in accordance with an exemplary embodiment of the present disclosure, and FIG. 5 is a cross-sectional view taken along line I-I' of FIG. 4 in accordance with an embodiment of the present disclosure.

The example shown in FIG. 4 shows that the micro LED display panel 100 according to the present disclosure is arranged on the substrate 201 for the display device. In this case, the micro LED display panel 100 can be adhered in a module form to the substrate 201 for the display device in which the data line DL, the gate line GL, and the voltage source to source line VSS are arranged.

However, the present disclosure is not limited thereto. For example, a data line DL, a gate line GL, and a voltage source to source line VSS may be arranged on the substrate 110 for forming a micro LED and a transistor element. In this case, the data line DL, the gate line GL, the voltage source to source line VSS, the micro LED 120 and the transistor element 130 are all arranged on the substrate 110 such as a sapphire.

Referring to FIGS. 4 and 5, the data line DL, the gate line GL, and the voltage source to source line VSS are arranged on the substrate 201 for the display device. The source electrode 135*b* is connected to the data line DL. The gate electrode 133 is connected to the gate line GL. The p-type semiconductor layer 123 of the micro LED is electrically connected to the drain electrode 135*a* through the first connection wiring 140*a*. Also, the n-type semiconductor layer 121 of the micro LED is connected to the voltage source to source line VSS via the second connection wiring 140*b*.

In FIG. 5, the first connection wiring 140*a* is arranged on the first protection layer 150*a* through the contact hole penetrating through the first protection layer 150*a* and the second connection wiring 140*b* is arranged on the second protection layer 150*b* through the contact holes penetrating through the first protection layer 150*a* and/or the second protection layer 150*b*. It is a structure that the first connection wiring 140*a* is first formed, and then, the second connection wiring 140*b* is formed.

Figure 7:
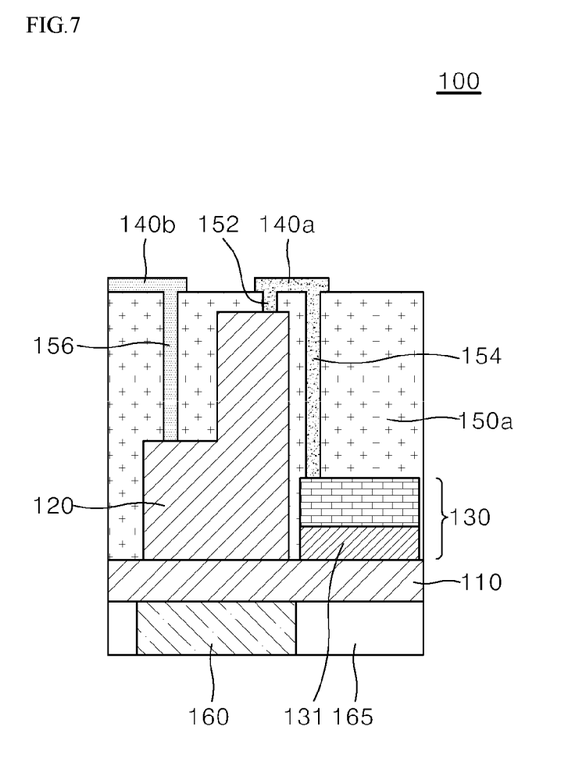
FIG. 7 is a schematic cross-sectional view of a micro LED display panel in accordance with an exemplary embodiment of the present disclosure.

However, the present disclosure is not limited thereto, and as the examples shown in FIG. 7, each first connection wiring 140*a* and second connection wiring 140*b* are arranged on the first protection layer 150*a* through the contact hole penetrating through the first protection layer 150*a*. It can be seen as the structure that the first connection wiring 140*a* and the second connection wiring 140*b* are formed at the same time. Thus, both the first connection wiring 140*a* and the second connection wiring 140*b* may contact the first protection layer 150*a*.

The connection wiring structure shown in FIG. 5 can be applied when the first connection wiring 140*a* and the second connection wiring 140*b* are overlapped, and the connection wiring structure shown in FIG. 7 can be applied when the first connection wiring 140a and the second connection wiring 140b are not overlapped.

According to the micro LED display panel of the present disclosure, the micro LEDs 120 and the transistor elements 130 for driving the micro LEDs 120 may be arranged on the same plane on the substrate 110. The micro LED 120 and the transistor element 130 for driving the micro LED 120 may be disposed horizontally adjacent to each other on the substrate 110. Specifically, the micro LED 120 and the transistor element 130 may be disposed to overlap in a direction parallel to the substrate 110. Accordingly, the thickness of the micro LED display panel can be thinned, and the contact holes having a relatively low aspect ratio can be formed as compared with a stacked structure.

Hereinafter, a method of manufacturing the micro LED display panel shown in FIG. 4 will be described with reference to FIGS. 6A to 6G.

Figure 6A:
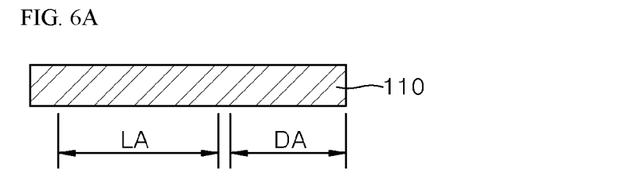
FIGS. 6A to 6G show a method of manufacturing a micro LED display panel in accordance with an exemplary embodiment of the present disclosure.

First, a substrate 110 is prepared as the example shown in FIG. 6A. The substrate 110 may be the sapphire substrate. In the substrate 110, a light emitting region LA and a driving region DA are defined in advance.

Figure 6B:
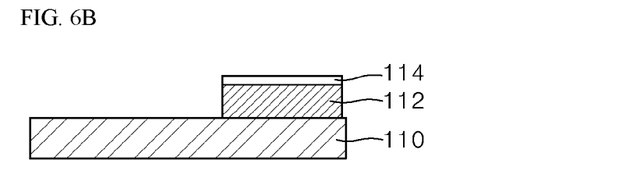

Then, as the example shown in the FIG. 6B, an amorphous silicon layer 112 is arranged in the driving region DA on the substrate 110, and a temporary protection layer 114 is arranged on the amorphous silicon layer 112. The amorphous silicon layer 112 may be formed by patterning after depositing amorphous silicon on the substrate. The temporary protection layer 114 serves as an etch stop layer in an etching process for manufacturing a micro LED, which will be described later.

Figure 6C:
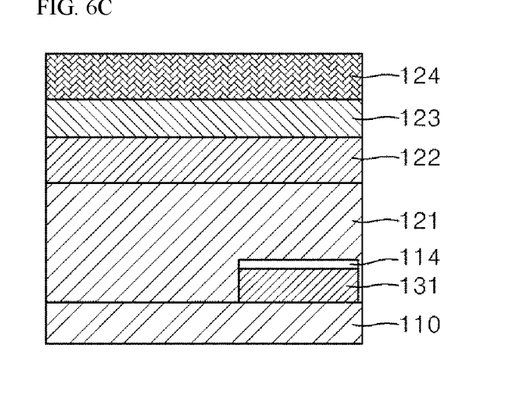

Then, as the example shown in FIG. 6C, an epitaxial growth process is performed on the substrate 110 on which the amorphous silicon layer 112 and the temporary protection layer 114 are arranged.

A n-type semiconductor layer 121, an active layer 122 and a p-type semiconductor layer 123 can be formed through the epitaxial growth process. The n-type semiconductor layer 121, the active layer 122, and the p-type semiconductor layer 123 may be formed of a nitride semiconductor, respectively. The nitride semiconductor represented by GaN can be epitaxial grown on a sapphire substrate with the excellent crystal quality.

The nitride-based LED may be formed by a metal organic chemical vapor deposition (MOCVD) process on the sapphire substrate, but is not limited thereto. For example, it may be realized by a method such as Molecular Beam Epitaxy (MBE), Plasma Enhanced Chemical Vapor Deposition (PECVD) and Vapor Phase Epitaxy (VPE). The MOCVD process can be proceeded at about 900° C. to about 1300° C.

Also, in this step, the amorphous silicon layer 112 can be converted into a polysilicon layer 131, that is, the active layer. It is possible to heat the amorphous silicon layer 112 before the epitaxial growth process or after the epitaxial growth process to convert it into the polysilicon layer 131 but preferably without a separate process of converting into the separate polysilicon layer 131, the amorphous silicon layer 114 can be converted into the polysilicon layer 131 using high temperature of about 900° C. to about 1300° C. applied to the epitaxial growth process. That is, the amorphous silicon can be converted into polysilicon without a separate conversion process due to high temperature in the process for forming the LED.

Accordingly, it is possible to manufacture polysilicon in the process of LED epitaxial growth, and it is possible to manufacture the polysilicon thin film transistor on a sapphire substrate based on the above. For example, as in the embodiments of the present disclosure, a high temperature LED forming process is performed in a state in which the amorphous silicon layer is arranged on the sapphire substrate, the amorphous silicon can convert into polysilicon which is crystalline without a separate heat treatment process or laser irradiation process.

Meanwhile, as the example shown in FIG. 6C, a conductive layer 124b may be further arranged on the p-type semiconductor layer 123C. The p-type semiconductor layer 123 has the relatively high resistance compared to the n-type semiconductor layer 121 and a current uniformity can be degraded. Thus, in order to improve the above, the conductive layer 124b can be formed with the metal or the transparent conductive oxide on the p-type semiconductor layer 123. Of course, a conductive layer 124a can be formed on the n-type semiconductor layer 121 as shown in the example shown in FIG. 2.

Figure 6D:
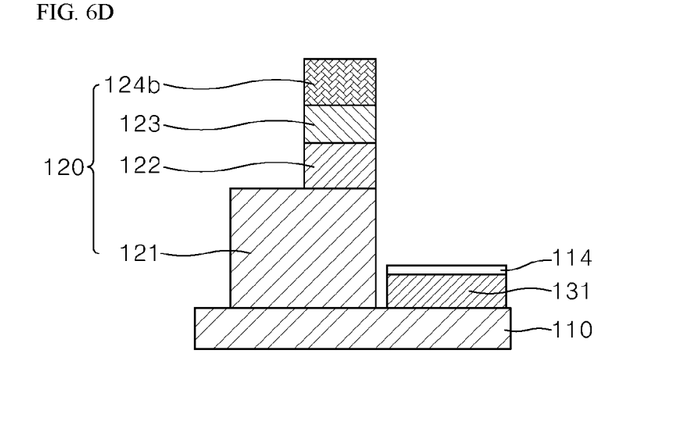

Then, as the example shown in FIG. 6D, a micro LED can be manufactured by removing the n-type semiconductor layer 121, the active layer 122, and the p-type semiconductor layer 123 in a remaining region except the light emitting region. This can be performed by the etching process using a mask. Further, in order to form the wirings, the additional etching can be performed so as to expose a part of the n-type semiconductor layer 121 in the etching process.

Figure 6E:
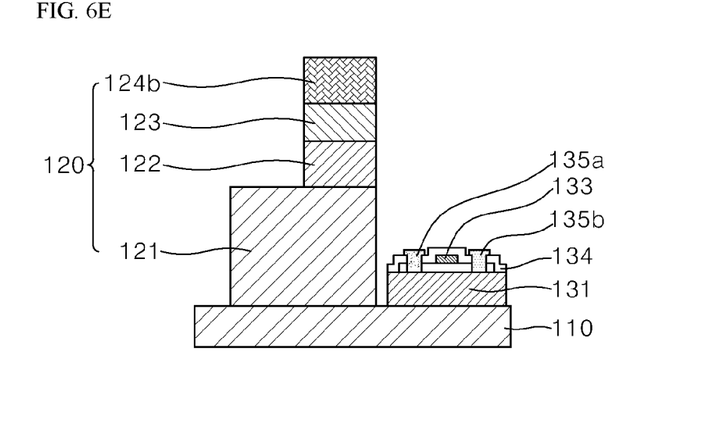

Then, as the example shown in FIG. 6E, a transistor element 130 can be manufactured on the polysilicon layer 131, after removing the temporary protection layer 114. The structure and manufacturing method of the polysilicon thin film transistor device are very diverse, but the following process is presented as a representative example. The transistor element shown in FIG. 6E has substantially the same structure as that shown in FIG. 3, and thus, the description related to FIG. 3 can be applied itself.

First, a gate insulating layer 132 is formed on the polysilicon layer 131. Then, a gate electrode 133 is formed on the gate insulating layer 132. Then, a source region and the drain region in the polysilicon layer 131 are formed by an ion implantation process. Thereafter, an inter layer dielectric 134 is formed on the gate insulating layer 132 and the gate electrode 133.

Thereafter, a contact holes are formed in the gate insulating layer 132 and the inter layer dielectric 134 on the source region and the drain region. Then, a source electrode 135b and a drain electrode 135a, which are connected to the source region and the drain region through the contact holes, are formed on the inter layer dielectric 134.

Figure 6F:
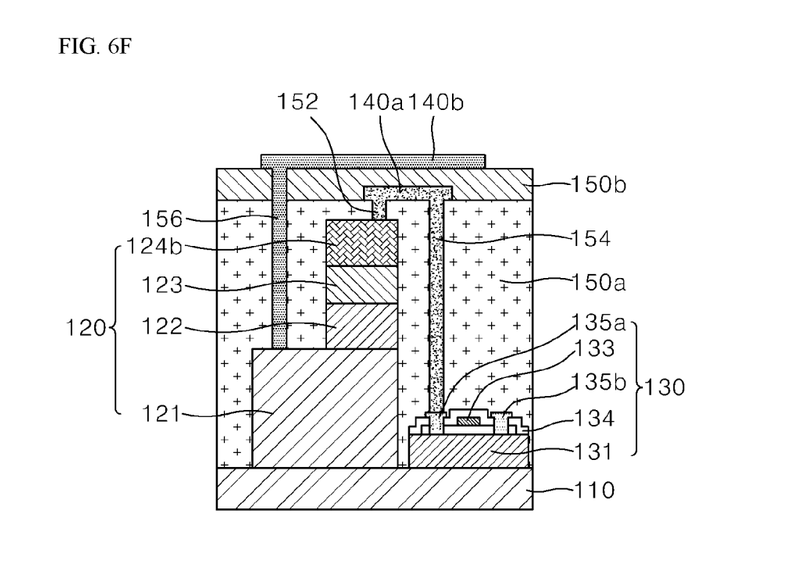

Then, as the example shown in FIG. 6F, a first connection wiring 140a for electrically connecting the drain electrode 135a of the transistor element 130 and the p-type semiconductor layer 123 of the micro LED 120 is formed and a second connection wiring 140b for electrically connecting the n-type semiconductor layer 121 of the micro LED 120 to an external voltage source to source line VSS is formed. The first connection wiring 140a and the second connection wiring 140b may be formed after mounting the micro LED display panel on the display device substrate. In addition, as the example shown in FIG. 5, the first connection wiring 140a and the second connection wiring 140b may be sequentially formed, and as the example shown in FIG. 7, the first connection wiring 140a and the second connection wiring 140b may be formed at the same time.

In the example shown in FIG. 6F, the first connection wiring 140a can be formed by forming a first protection layer 150a on the substrate 110 on which the micro LEDs 120 and the transistor elements 130 for driving the micro LEDs 120 are arranged, forming a contact hole, and depositing a metal. The first protection layer 150a may be formed with one or more first contact holes 152 and 154. The first connection wiring 140a may electrically connect the micro LED 120 to the transistor element 130 through the first contact holes 152 and 154. In addition, the second connection wiring can be formed by forming a second protection layer 150b on the first protection layer 150a formed with the first connection wiring 140a, forming a contact hole, and depositing a metal. The first protection layer 150a and the second protection layer 150b may be formed with one or more second contact holes 156, and the second connection wiring 140b may electrically connect the micro LED 120 to the voltage source to source line VSS through the one or more second contact holes 156.

Figure 6G:
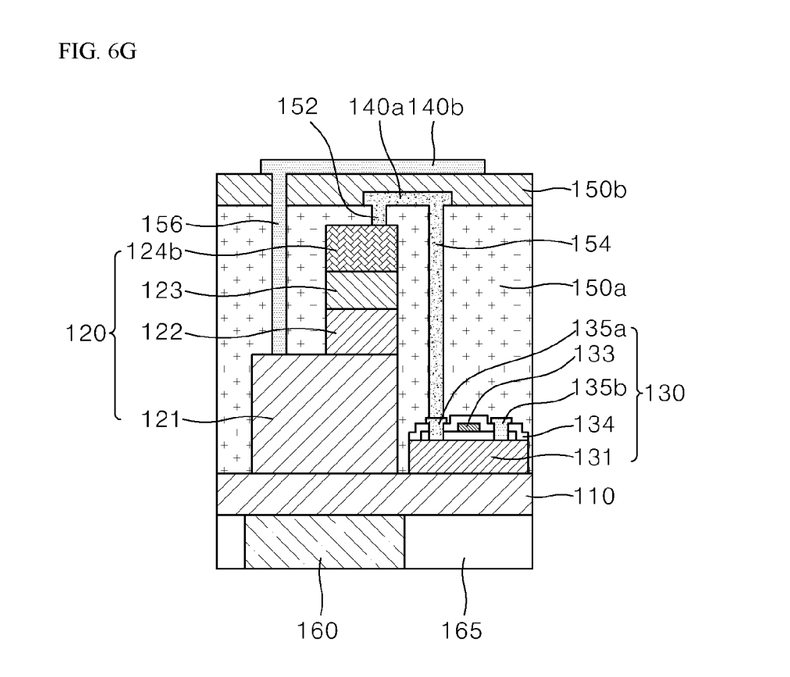

Then, as the example shown in FIG. 6G, a color adjustment layer 160 can be arranged on the light emitting region under the substrate 110. The color adjustment layer 160 may include at least one of the color conversion film and the color filter. The color conversion material such as a fluorescent material or a quantum dot can be included in the color conversion film.

In addition, as the example shown in FIG. 6G, a bank layer 165 can be further arranged in the region except the light emitting region under the substrate 110 for preventing a light leakage.

In the manner as the examples shown in FIGS. 6A to 6G, by forming the micro LED 120 and the transistor element 130 for driving the micro LED on the same plane on the substrate 110, the micro LED display panel can be manufactured without a transferring process of the chip in which the micro LED is formed.

While the embodiments of the present invention have been mainly described hereinabove, various modifications or variations can be made in a level of those skilled in the person. Therefore, it is to be understood that it is included in the scope of the present invention unless such modifications and variations deviate the scope of the present invention.

What is claimed is:

1. A micro light emitting diode (LED) display panel, comprising:
    a substrate having a light emitting region and a driving region;
    a micro LED arranged in the light emitting region on the substrate;
    a transistor element which is arranged in the driving region on the substrate and drives the micro LED;
    a first protection layer covering the micro LED and the transistor element, the first protection layer including one or more first contact holes; and
    a first connection wiring electrically connecting the micro LED to the transistor element through the one or more first contact holes in the first protection layer,
    wherein the transistor element is a polysilicon thin film transistor element having a polysilicon active layer,
    wherein at least a part of the micro LED and the polysilicon active layer of the transistor element contact the substrate.

2. The micro LED display panel of claim 1, wherein the micro LED and the transistor element are horizontally adjacent to each other on the substrate.

3. The micro LED display panel of claim 2, wherein the polysilicon active layer does not overlap with the micro LED in a vertical direction.

4. The micro LED display panel of claim 1,
    wherein the substrate is a sapphire substrate,
    wherein the micro LED is a nitride based micro LED.

5. The micro LED display panel of claim 1, wherein the micro LED includes a p-type semiconductor layer, wherein the transistor element includes a drain electrode, and wherein the first connection wiring electrically connects the p-type semiconductor layer of the micro LED to the drain electrode of the transistor element through the one or more first contact holes.

6. The micro LED display panel of claim 1, wherein the first protection layer further includes a second contact hole, and wherein the micro LED display panel further comprises:
    a source line extending in a first direction; and
    a second connection wiring electrically connecting the micro LED to the source line through the second contact hole.

7. The micro LED display panel of claim 6, wherein the micro LED includes a n-type semiconductor layer, and wherein the second connection wiring electrically connects the n-type semiconductor layer of the micro LED to the source line through the second contact hole.

8. The micro LED display panel of claim 7, wherein the micro LED further includes a p-type semiconductor layer on the n-type semiconductor layer, at least a part of the n-type semiconductor layer horizontally extending beyond the p-type semiconductor layer, and wherein the second connection wiring contacts the part of the n-type semiconductor layer.

9. The micro LED display panel of claim 6, wherein the source line is arranged on the substrate.

10. The micro LED display panel of claim 6, wherein the micro LED display panel is mounted on another substrate, and wherein the source line is disposed on the another substrate.

11. The micro LED display panel of claim 6, further comprising a second protection layer disposed on the first protection layer and the first connection wiring, and wherein the second connection wiring is disposed on the second protection layer.

12. The micro LED display panel of claim 6, wherein the first connection wiring and the second connection wiring contact the first protection layer.

13. The micro LED display panel of claim 1, further comprising a color adjustment layer in a light emitting region under the substrate.

14. The micro LED display panel of claim 1, further comprising a bank layer arranged in a region excluding the light emitting region under the substrate.

15. The micro LED display panel of claim 5, further comprising a conductive layer on the p-type semiconductor layer for current disperse of the p-type semiconductor layer.

16. A micro light emitting diode (LED) display panel, comprising:
    a substrate having a light emitting region and a driving region;
    a micro LED arranged in the light emitting region on the substrate;
    a transistor element that is arranged in the driving region on the substrate and drives the micro LED, the transistor element horizontally adjacent to the micro LED on the substrate;
    a protection layer covering the micro LED and the transistor element; and
    a first connection wiring electrically connecting the micro LED to the transistor element,
    wherein the transistor element is a polysilicon thin film transistor element having a polysilicon active layer, wherein at least a part of the micro LED and the polysilicon active layer of the transistor element contact the substrate.

17. The micro LED display panel of claim 16, wherein the polysilicon active layer does not overlap with the micro LED in a vertical direction.

18. The micro LED display panel of claim 16,
wherein the protection layer includes a first contact hole exposing a portion of the micro LED and a second contact hole exposing a portion of the transistor element, and
wherein the first connection wiring includes a first part extending vertically to contact the exposed portion of the micro LED through the first contact hole, and a second part extending vertically to contact the exposed portion of the transistor element through the second contact hole to electrically connect the micro LED to the transistor element.

19. The micro LED display panel of claim 16, further comprising a color adjustment layer in a light emitting region under the substrate.

20. The micro LED display panel of claim 15, wherein the conductive layer is made of a metal.

\* \* \* \* \*